US012543260B1

(12) United States Patent
Meiguni et al.

(10) Patent No.: US 12,543,260 B1
(45) Date of Patent: Feb. 3, 2026

(54) ENHANCED ELECTROSTATIC DISCHARGE TRAP FOR MICROPHONES

(71) Applicant: Amazon Technologies, Inc., Seattle, WA (US)

(72) Inventors: Javad Soleiman Meiguni, San Jose, CA (US); Ki-Hyuk Kim, Sunnyvale, CA (US); Kevin Li, Bellevue, WA (US)

(73) Assignee: Amazon Technologies, Inc., Seattle, WA (US)

( * ) Notice: Subject to any disclaimer, the term of this patent is extended or adjusted under 35 U.S.C. 154(b) by 199 days.

(21) Appl. No.: 18/345,526

(22) Filed: Jun. 30, 2023

(51) Int. Cl.
*H03G 11/00* (2006.01)
*H04R 1/02* (2006.01)
*H04R 1/08* (2006.01)
*H04R 3/00* (2006.01)
*H04R 19/04* (2006.01)
*H05K 1/02* (2006.01)
*H04R 29/00* (2006.01)

(52) U.S. Cl.
CPC ........... *H05K 1/0259* (2013.01); *H04R 1/028* (2013.01); *H04R 1/086* (2013.01); *H04R 3/007* (2013.01); *H04R 19/04* (2013.01); *H04R 2201/003* (2013.01); *H04R 2499/11* (2013.01)

(58) Field of Classification Search
CPC ...... H05K 1/0259; H04R 1/086; H04R 3/007; H04R 1/028; H04R 19/04; H04R 2201/003
USPC ...................................................... 381/55, 56
See application file for complete search history.

(56) References Cited

U.S. PATENT DOCUMENTS

2018/0098143 A1\* 4/2018 Silvestri .................... H04R 1/02
2023/0232144 A1\* 7/2023 Shringarpure ......... H02H 9/046
381/355

FOREIGN PATENT DOCUMENTS

JP 2012527127 A \* 11/2012 ............. H01L 24/82

\* cited by examiner

*Primary Examiner* — Ammar T Hamid
(74) *Attorney, Agent, or Firm* — Eversheds Sutherland (US) LLP

(57) ABSTRACT

An electrostatic discharge trap device for protecting a water-resistant microphone from electrostatic discharge may include a conductive material positioned between a microphone port and a microphone venting stack-up to prevent liquid entry into the microphone, wherein the electrostatic discharge trap device is configured to receive an electric spark from the microphone port and conduct the electric spark away from the microphone venting stack-up to a conductive layer.

20 Claims, 3 Drawing Sheets

ENHANCED ELECTROSTATIC DISCHARGE TRAP FOR MICROPHONES

BACKGROUND

Some MEMS (Micro-Electro-Mechanical Systems) microphones are sensitive to electrical and mechanical stresses, such as high voltage levels or electrostatic force associated with electrostatic discharge, shockwaves due to electrostatic discharge spark, or high-pressure pulses due to a device being dropped. Some mesh materials of a MEMS microphone are water-resistant, but may not have an electrostatic discharge trap that maintains the water resistance.

BRIEF DESCRIPTION OF THE DRAWINGS

To easily identify the discussion of any particular element or act, the most significant digit or digits in a reference number refer to the figure number in which that element is first introduced.

Figure 1:
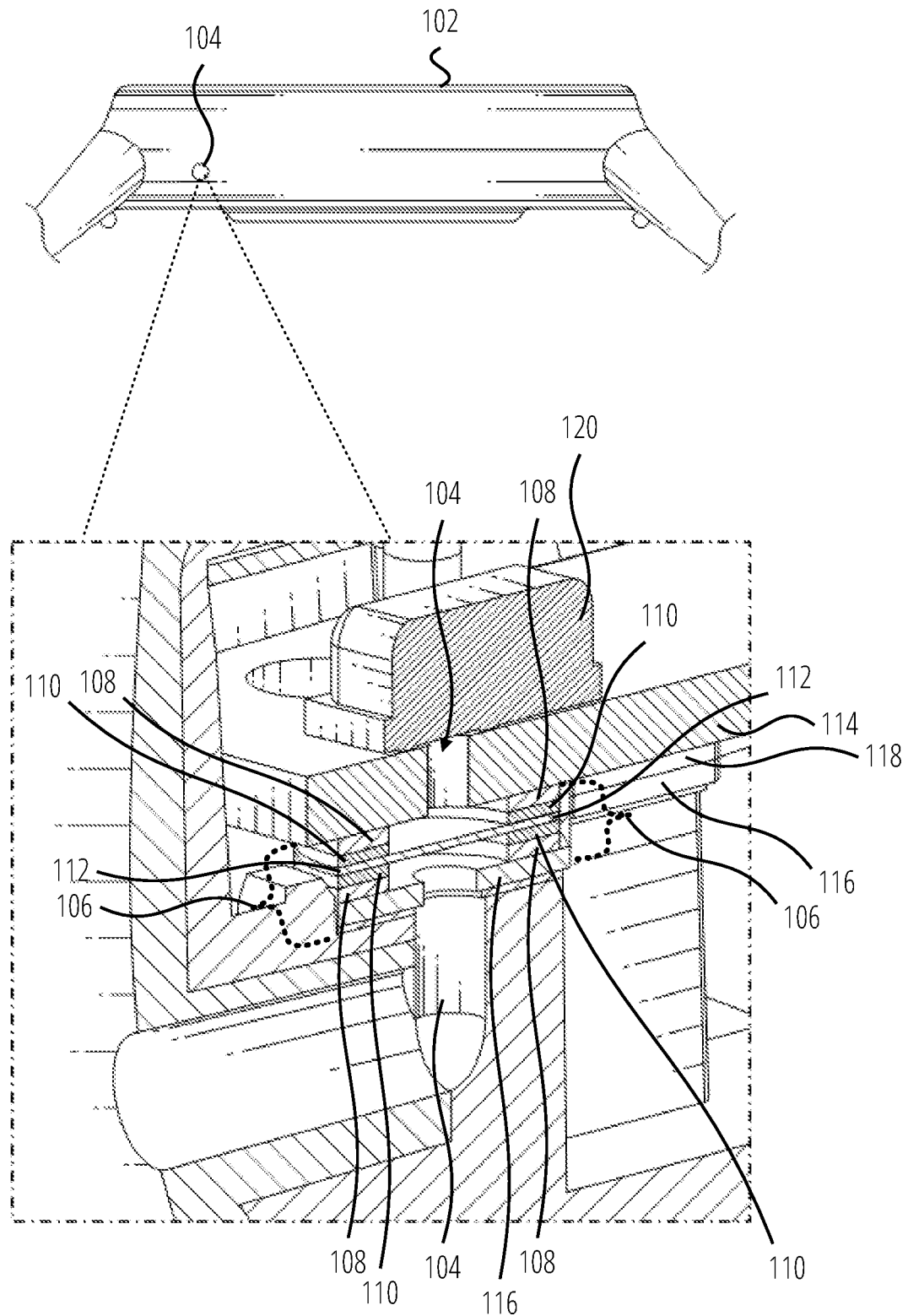
FIG. 1 illustrates an example device with an electrostatic discharge trap for a microphone venting stack-up shown in a cross-section view, in accordance with one or more embodiments of the present disclosure.

Certain implementations will now be described more fully below with reference to the accompanying drawings, in which various implementations and/or aspects are shown. However, various aspects may be implemented in many different forms and should not be construed as limited to the implementations set forth herein; rather, these implementations are provided so that this disclosure will be thorough and complete, and will fully convey the scope of the disclosure to those skilled in the art. Like numbers in the figures refer to like elements throughout. Hence, if a feature is used across several drawings, the number used to identify the feature in the drawing where the feature first appeared will be used in later drawings.

DETAILED DESCRIPTION

Overview

Example embodiments described herein provide an enhanced electrostatic discharge trap for microphones.

Micro-electromechanical systems (MEMS) microphones are sensitive to electrical and mechanical stresses, and any types of electrical and/or mechanical stress could cause MEMS microphone damages. Two examples are 1) electrical stress such as high voltage levels associated with electrostatic discharge (ESD) or electrostatic force due to an ESD gun could cause partial damage of diaphragm/backplane of MEMS microphone, and 2) mechanical stress such as shockwaves due to ESD spark or high-pressure pulses due to dropped device could cause complete damage of a microphone diaphragm/backplane. Physical damages of MEMS microphones due to ESD may occur during assembly/handling process in factories or reliability/compliance ESD tests.

ESD protection of microphone mesh material is important to prevent damage to the microphone components and ensure reliable operation. Some ESD protections for microphone mesh materials include conductive coatings (e.g., for a low-impedance path for ESD current), shielding (e.g., to prevent ESD from reaching sensitive components), grounding and ESD traps (e.g., to divert ESD currents away from sensitive components to a low-impedance path to ground). These concepts can be used in combination to provide comprehensive ESD protection for microphone mesh materials.

Sealing membranes are important to a microphone venting stack-up because they prevent dust, moisture, and other contaminants from entering the microphone's internal components, which could compromise the microphone's performance or cause damage. A well-designed sealing membrane also allows sound waves to enter the microphone while keeping unwanted particles out. The sealing membrane material should be selected carefully to ensure that it does not affect the microphone's sensitivity or frequency response. The sealing membrane should also be durable enough to withstand the microphone's use and environment.

There are several types of mesh materials of microphones, including metal mesh (e.g., stainless steel for microphone grilles), polyethylene terephthalate (PET) mesh, acoustic foam, conductive polymer, and other conductive/insulating materials, such as perforated metal or conductive foam. The mesh material may be a membrane mesh, a hydrophobic mesh, or a woven mesh.

Some devices with microphones may be water resistant. However, to maintain water resistance (e.g., up to 5 atmospheres or more), an enhanced ESD trap is needed for microphones because of the following reasons. (1) Water ingress through the microphone port requires microphone membrane/hydrophobic microphone mesh instead of woven microphone mesh. (2) Microphone membrane can be damaged due to ESD, leading to water ingress into the microphone, or damage spark may break the air. (3) Diaphragm/backplane of a MEMS microphone may be damaged due to electrical/mechanical stress caused by ESD.

A microphone venting stack-up refers to the design and construction of the acoustic vents in a microphone to achieve optimal sound quality and performance. The acoustic vents in a microphone are small openings that allow sound waves to enter the microphone and reach the diaphragm. The stack-up design of these vents is crucial because it affects the sensitivity, frequency response, and distortion of the microphone. The stack-up design of microphone venting typically involves the placement and size of acoustic vents, the distance between them, and the type of material used to construct them. Designing the venting stack-up can be complex, as it requires balancing the acoustic performance of the microphone with its mechanical and electrical characteristics. A well-designed ESD robust microphone venting stack-up aims to ensure that the microphone captures an accurate representation of the sound source while minimizing unwanted noise and distortion.

The placement and design of the ESD trap in a microphone venting stack-up are crucial considerations in microphone design. They play a significant role in determining the quality of sound that the microphone produces, as well as the device's robustness against high voltage noise.

In one or more embodiments, an enhanced ESD trap protects a microphone stack-up from ESD while maintaining water resistance. Due to the enhanced ESD trap's geometry and location, which may be closer to the device exterior than to the sealing microphone mesh, the ESD trap may operate by attracting the ESD spark. The spark then dissipates to system ground through the conductive foam connected to system ground. Proper placement and installation of the sealing membrane are important to ensure effective protection and optimal microphone performance in a water-resistant device. The integrated ESD trap inside the microphone stack-up is intended to provide a low-resistance path to ground for the ESD current before it reaches the sensitive diaphragm/backplane layer or other nearby circuitry.

In one or more embodiments, an ESD trap may be used to divert sparks to the system ground, protecting the microphone membrane venting stack-up against transient noise voltages. A metallic ESD trap is positioned in front of a microphone membrane, which is different from some ESD protection structures with woven microphone mesh.

In one or more embodiments, the ESD trap may be bonded to a printed circuit board/system grounding using a conductive material such as copper (Cu) tape, conductive foam, or the like, or a TVS (Transient Voltage Suppressor) diode.

In one or more embodiments, the enhanced ESD design leads to a water-resistant specification of up to 5 atmospheres (ATM). This is the first time a customized ESD trap has been used to protect the microphone venting stack-up while maintaining the water-resistant specification.

In one or more embodiments, an optimized 6 mm$^2$ area of the ESD trap may be obtained to provide sufficient grounding using conductive foam. To this aim, a rectangular-shaped conductive foam with dimensions larger than 1.5 mm×4 mm may be used. The placement and design of the ESD trap, which may be closer to the device exterior than the sealing microphone mesh, may provide a low-impedance path to attract the ESD spark before the spark reaches the sealing microphone. The spark then dissipates to system ground through the conductive foam connected to system ground. The equivalent resistance of the conductive foam under different compression levels may be between 0.1 Ohm and 1.8 Ohm, as an example.

In one or more embodiments, the ESD trap design in the microphone venting stack-up may divert an ESD spark to a system ground (e.g., on a printed circuit board) before the spark reaches a sealing membrane of the microphone. The ESD trap may use materials such as stainless steel, copper, or silver. Conductive foam, copper tape, spring clips, and/or direct contact may connect the ESD trap to the printed circuit board. The ESD trap may divert the spark to a ground or to a TVS diode connected to system ground. An optimized 6 millimeters$^2$ area may be used to provide sufficient grounding using the conductive foam, so a rectangular-shaped conductive foam may be used with dimensions larger than 1.5 mm-4 mm. The placement and design of the ESD trap being closer to the device exterior than the sealing microphone mesh may provide a low-impedance path to attract the ESD spark before the spark reaches the sealing microphone mesh.

The above descriptions are for purposes of illustration and are not meant to be limiting. Numerous other examples, configurations, processes, etc., may exist, some of which are described in greater detail below. Example embodiments will now be described with reference to the accompanying figures.

Illustrative Processes and Use Cases

FIG. 1 illustrates an example device 102 with an electrostatic discharge trap for a microphone venting stack-up shown in a cross-section view, in accordance with one or more embodiments of the present disclosure.

Referring to FIG. 1, the device 102 may include a microphone port 104, whose components are shown in detail. The microphone port 104 may include a microphone port 104, a stack-up 106 (e.g., venting stack-up) including multiple layers of a compression material 108, multiple layers of a stiffener 110 (e.g., an adhesive), and a sealing membrane 112 (e.g., for water protection—preventing liquid entry/passage). As shown in FIG. 1, a layer of the compression material 108 may be positioned in between the stiffener 110 and a printed circuit board (PCB 114). The sealing membrane 112 may abut a layer of the stiffener 110 on each side so that the stiffener 110 is between the sealing membrane 112 and the compression material 108 on one side, and between the sealing membrane 112 and the compression material 108 on the other side. In this manner, the stack-up 106 may be attached to the PCB 114.

Still referring to FIG. 1, to provide ESD protection, an ESD trap 116 may be the first layer exposed to the microphone port 104. For example, the ESD trap 116 may be positioned between the microphone port 104 and the stack-up 106 to intercept (e.g., receive) and divert any ESD spark from the microphone port 104. A conductive layer 118 between the ESD trap 116 and the PCB 114 may divert the ESD spark from the ESD trap 116 away from the stack-up 106 (e.g., to a ground or diode on the PCB 114). The ESD trap 116 may be conductive to cause an ESD spark from the microphone port 104 to travel to the conductive layer 118, which may allow the ESD spark to continue to travel away from the stack-up 106 due to the conductivity. A microphone 120 may be positioned at the opposite side of the PCB 114 from the ESD trap 116. The microphone port 104 may extend through the ESD trap 116, through the stack-up 106, and through the PCB 114 to the microphone 120, which may be attached to the PCB 114. In this manner, placement of the ESD trap 116 between the microphone port 104 and the stack-up 106 may prevent ESD damage to the sealing membrane 112 while allowing the stack-up 106 to provide water and other protection to the microphone 120.

In one or more embodiments, the microphone 120 may be a MEMS microphone. MEMS microphones are sensitive to electrical and mechanical stresses, and any type of electrical and/or mechanical stress could cause MEMS microphone damages. Other microphone types may be used as well.

In one or more embodiments, the type of mesh used by the microphone port 104 may include a metal mesh, a PET mesh, an acoustic foam, a conductive polymer, or other conductive materials such as perforated metal or conductive foam, can also be used in microphone grilles to provide ESD protection. Metal mesh, such as stainless steel, may be used for microphone grilles due to its durability and high conductivity, which provides ESD protection. PET mesh is a lightweight and transparent material that may be used in microphone grilles due to its clarity, flexibility, and affordability. Acoustic foam can be used as a protective covering for the microphone diaphragm, helping to reduce unwanted noise and protect the microphone components. Conductive polymers, such as polycarbonate and polyethylene, can be used in microphone grilles to provide ESD protection. These materials are lightweight and flexible, making them a good choice for use in microphones.

In one or more embodiments, the microphone port 104 mesh material may use stainless steel mesh, nickel-plated mesh, brass mesh, conductive polymer mesh, or aluminum mesh. Stainless steel mesh is strong, durable, and has good conductive properties, making it an option for microphone membranes. It can be electro-polished to improve its conductive properties, and may be used in high-end microphones. Nickel-plated mesh has good conductive properties and is also resistant to corrosion, making it an option for microphone membranes. It may be used in high-end microphones due to its durability and low noise characteristics. Brass mesh is a soft metal that may be used in microphone membranes due to its ease of forming and low cost. However, it is less durable than stainless steel or nickel-plated mesh and may not be suitable for all applications. Conductive polymer mesh is made from a conductive polymer material, such as polyethylene-doped polypropylene, and may be used in microphone membranes due to its high conductivity and low noise characteristics. Aluminum mesh is lightweight and has strong conductive properties, making it an option for microphone membranes. It may be used in low-cost microphones, but may not be suitable for all applications due to its limited durability.

In one or more embodiments, the microphone port 104 may use a hydrophobic mesh to prevent water ingress and protect sensitive components from damage. The hydrophobic coating provides an extra layer of protection against water ingress and can help to improve the overall durability and reliability of the microphone. Hydrophobic meshes include hydrophobic stainless steel mesh, hydrophobic nickel-plated mesh, hydrophobic conductive polymer mesh, and hydrophobic aluminum mesh. Stainless steel mesh can be treated with a hydrophobic coating to make it water-resistant. This type of mesh is durable and has good conductive properties, making it an option for microphone membranes in high-end microphones. Nickel-plated mesh can also be treated with a hydrophobic coating to make it water-resistant. This type of mesh is corrosion-resistant and has good conductive properties, making it an option for microphone membranes in high-end microphones. Conductive polymer mesh can be treated with a hydrophobic coating to make it water-resistant. This type of mesh is lightweight, has good conductive properties, and may be used in microphone membranes due to its high conductivity and low noise characteristics. Aluminum mesh can be treated with a hydrophobic coating to make it water-resistant. This type of mesh is lightweight and has good conductive properties, making it an option for microphone membranes in low-cost microphones.

In one or more embodiments, the device 102 may be a mobile device, including wearable devices, such as smart devices, rings, watches, glasses, armbands, smartphones, tablets, laptops, hearable devices (e.g., earbuds), and the like.

In one or more embodiments, the conductive layer 118 may be rectangular with dimensions of at least 1.5 mm×4 mm to cover an area of the ESD trap 116 of at least 6 mm$^2$.

Figure 2:
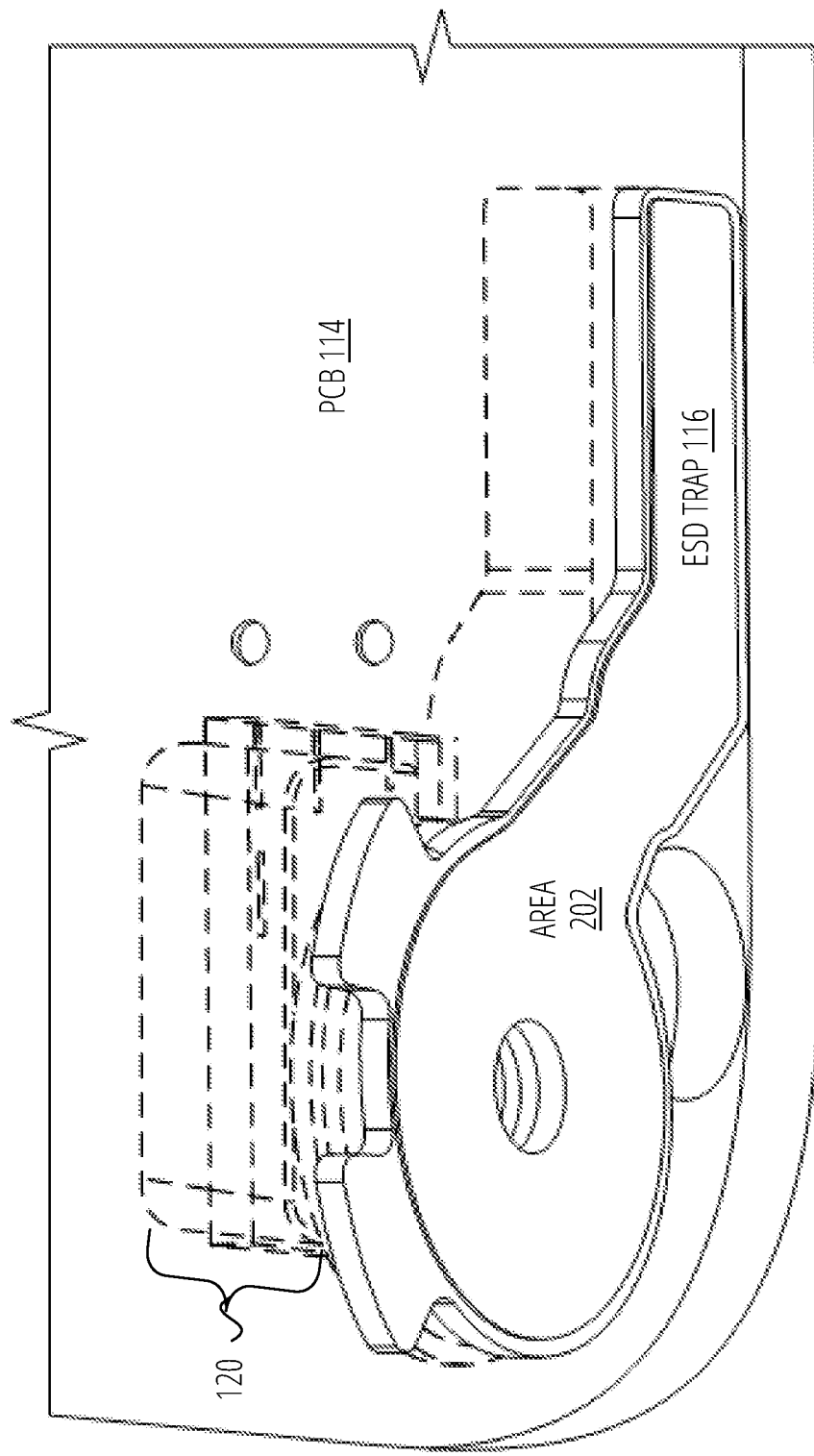
FIG. 2 illustrates the electrostatic discharge trap of FIG. 1 for the microphone venting stack-up, in accordance with one or more embodiments of the present disclosure.

FIG. 2 illustrates the electrostatic discharge ESD trap 116 of FIG. 1 for the microphone venting stack-up, in accordance with one or more embodiments of the present disclosure.

Referring to FIG. 2, the ESD trap 116 is shown on one side of the PCB 114 (e.g., a side opposite the microphone 120). An area 202 of the ESD trap 116 may be at least 6 mm$^2$. Accordingly, the conductive layer 118 of FIG. 1 used between the ESD trap 116 and the PCB 114 may be rectangular with dimensions of at least 1.5 mm×4 mm to abut the entire area 202 of the ESD trap 116 on the side proximal to the 114 so that an ESD spark may be diverted away from the stack-up 106 of FIG. 1. As shown in FIG. 2, the ESD trap 116 may use a ring shape, but may use other shapes alternatively.

Referring to FIGS. 1 and 2, the microphone 120 may be a MEMS microphone or other type of microphone, and may be bottom-ported as shown. However, the stack-up 106 and the ESD trap 116 are not limited in application to a bottom-ported microphone, and may be applied to other microphone configurations in which the stack-up 106 and the ESD trap 116 are arranged such that the ESD trap 116 is exposed to the microphone port 104 first so that any ESD sparks are diverted away from the stack-up 106 prior to the stack-up 106 being exposed to the sparks. The ESD trap 116 also may be considered part of the stack-up 106 as the first layer of the stack-up 106 exposed to the microphone port 104.

Figure 3:
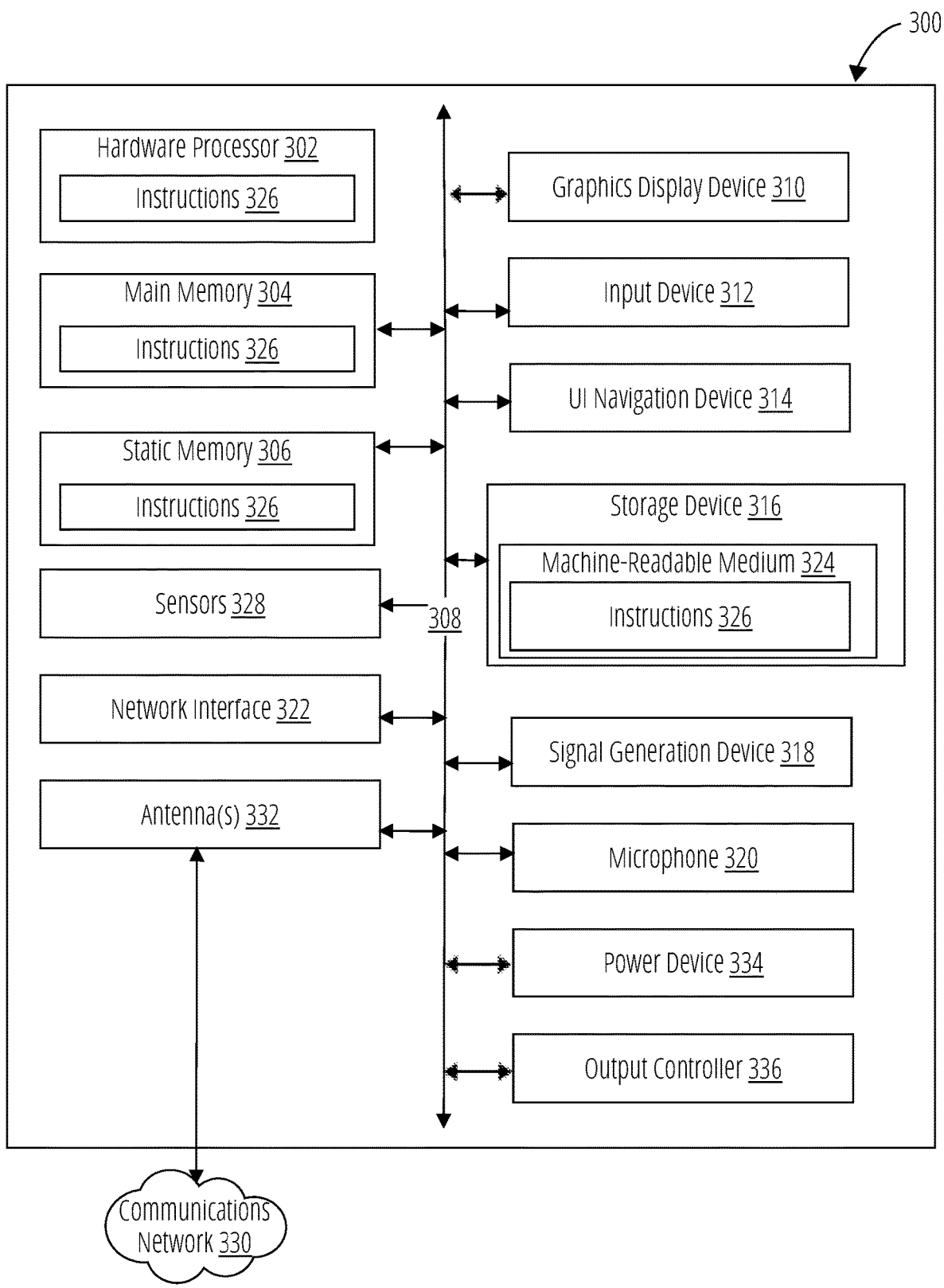
FIG. 3 illustrates a block diagram of an example machine upon which any of one or more techniques (e.g., methods) may be performed, in accordance with one or more example embodiments of the present disclosure.

FIG. 3 illustrates a block diagram of an example machine 300 upon which any of one or more techniques (e.g., methods) may be performed, in accordance with one or more example embodiments of the present disclosure. For example, the machine 300 may represent at least a portion of the device 102 of FIG. 1.

In other embodiments, the machine 300 may operate as a standalone device or may be connected (e.g., networked) to other machines. The machine 300 may be a server, a personal computer (PC), a smart home device, a tablet PC, a personal digital assistant (PDA), a mobile telephone, a wearable computer device, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

Examples, as described herein, may include or may operate on logic or a number of components, modules, or mechanisms. Modules are tangible entities (e.g., hardware) capable of performing specified operations when operating. A module includes hardware. In an example, the hardware may be specifically configured to carry out a specific operation (e.g., hardwired). In another example, the hardware may include configurable execution units (e.g., transistors, circuits, etc.) and a computer readable medium containing instructions where the instructions configure the execution units to carry out a specific operation when in operation. The configuring may occur under the direction of the execution units or a loading mechanism. Accordingly, the execution units are communicatively coupled to the computer-readable medium when the device is operating. In this example, the execution units may be a member of more than one module. For example, under operation, the execution units may be configured by a first set of instructions to implement a first module at one point in time and reconfigured by a second set of instructions to implement a second module at a second point in time.

The machine 300 (e.g., computer system) may include a hardware processor 302 (e.g., a central processing unit (CPU), a graphics processing unit (GPU), a hardware processor core, or any combination thereof), a tensor processing unit (TPU), a main memory 304 and a static memory 306, some or all of which may communicate with each other via an interlink (e.g., bus 308). The machine 300 may further include a power device 334, a graphics display device 310, an input device 312 (e.g., a keyboard), and a user interface UI navigation device 314 (e.g., a mouse). In an example, the graphics display device 310, input device 312, and UI navigation device 314 may be a touch screen display. The machine 300 may additionally include a storage device 316, a signal generation device 318, one or more microphone 320 (e.g., including the microphone port 104, the stack-up 106, the ESD trap 116, and the microphone 120 of FIG. 1), a network interface 322 coupled to antenna(s) 332, and one or more sensors 328. The machine 300 may include an output controller 336, such as a serial (e.g., universal serial bus (USB), parallel, or other wired or wireless (e.g., infrared (IR), near field communication (NFC), etc.) connection to communicate with or control one or more peripheral devices (e.g., a printer, a card reader, etc.)).

The storage device 316 may include a machine-readable medium 324 on which is stored one or more sets of data structures or instructions 326 (e.g., software) embodying or utilized by any one or more of the techniques or functions described herein. The instructions 326 may also reside, completely or at least partially, within the main memory 304, within the static memory 306, or within the hardware processor 302 during execution thereof by the machine 300. In an example, one or any combination of the hardware processor 302, the main memory 304, the static memory 306, or the storage device 316 may constitute machine-readable media.

While the machine-readable medium 324 is illustrated as a single medium, the term "machine-readable medium" may include a single medium or multiple media (e.g., a centralized or distributed database, and/or associated caches and servers) configured to store the one or more instructions 326.

Various embodiments may be implemented fully or partially in software and/or firmware. This software and/or firmware may take the form of instructions contained in or on a non-transitory computer-readable storage medium. Those instructions may then be read and executed by one or more processors to enable performance of the operations described herein. The instructions may be in any suitable form, such as but not limited to source code, compiled code, interpreted code, executable code, static code, dynamic code, and the like. Such a computer-readable medium may include any tangible non-transitory medium for storing information in a form readable by one or more computers, such as but not limited to read only memory (ROM); random access memory (RAM); magnetic disk storage media; optical storage media; a flash memory, etc.

The term "machine-readable medium" may include any medium that is capable of storing, encoding, or carrying instructions for execution by the machine 300 and that cause the machine 300 to perform any one or more of the techniques of the present disclosure, or that is capable of storing, encoding, or carrying data structures used by or associated with such instructions. Non-limiting machine-readable medium examples may include solid-state memories and optical and magnetic media. In an example, a massed machine-readable medium includes a machine-readable medium with a plurality of particles having resting mass. Specific examples of massed machine-readable media may include non-volatile memory, such as semiconductor memory devices (e.g., electrically programmable read-only memory (EPROM), or electrically erasable programmable read-only memory (EEPROM)) and flash memory devices; magnetic disks, such as internal hard disks and removable disks; magneto-optical disks; and CD-ROM and DVD-ROM disks.

The instructions 326 may further be transmitted or received over a communications network 330 using a transmission medium via the network interface 322 utilizing any one of a number of transfer protocols (e.g., frame relay, internet protocol (IP), transmission control protocol (TCP), user datagram protocol (UDP), hypertext transfer protocol (HTTP), etc.). Example communications networks may include a local area network (LAN), a wide area network (WAN), a packet data network (e.g., the Internet), mobile telephone networks (e.g., cellular networks), plain old telephone (POTS) networks, wireless data networks (e.g., Institute of Electrical and Electronics Engineers (IEEE) 602.11 family of standards known as Wi-Fi®, IEEE 602.16 family of standards known as WiMax®), IEEE 602.15.4 family of standards, and peer-to-peer (P2P) networks, among others. In an example, the network interface 322 may include one or more physical jacks (e.g., Ethernet, coaxial, or phone jacks) or one or more antennas to connect to the communications network 330. The term "transmission medium" shall be taken to include any intangible medium that is capable of storing, encoding, or carrying instructions for execution by the machine 300 and includes digital or analog communications signals or other intangible media to facilitate communication of such software.

The operations and processes described and shown above may be carried out or performed in any suitable order as desired in various implementations. Additionally, in certain implementations, at least a portion of the operations may be carried out in parallel. Furthermore, in certain implementations, less than or more than the operations described may be performed.

The word "exemplary" is used herein to mean "serving as an example, instance, or illustration." Any embodiment described herein as "exemplary" is not necessarily to be construed as preferred or advantageous over other embodiments. The terms "computing device," "user device," "communication station," "station," "handheld device," "mobile device," "wireless device" and "user equipment" (UE) as used herein refers to a wireless communication device such as a cellular telephone, a smartphone, a tablet, a netbook, a wireless terminal, a laptop computer, a femtocell, a high data rate (HDR) subscriber station, an access point, a printer, a point of sale device, an access terminal, or other personal communication system (PCS) device. The device may be either mobile or stationary.

As used herein, unless otherwise specified, the use of the ordinal adjectives "first," "second," "third," etc., to describe a common object, merely indicates that different instances of like objects are being referred to and are not intended to imply that the objects so described must be in a given sequence, either temporally, spatially, in ranking, or in any other manner.

Some embodiments may be used in conjunction with various devices and systems, for example, a personal computer (PC), a desktop computer, a mobile computer, a laptop computer, a notebook computer, a tablet computer, a server computer, a handheld computer, a handheld device, a personal digital assistant (PDA) device, a handheld PDA device, an on-board device, an off-board device, a hybrid device, a mobile or portable device, a consumer device, a non-mobile or non-portable device, a wireless communication station, a wireless communication device, a video device, an audio device, an audio-video (A/V) device, and the like.

It is understood that the above descriptions are for purposes of illustration and are not meant to be limiting.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Program module(s), applications, or the like disclosed herein may include one or more software components including, for example, software objects, methods, data structures, or the like. Each such software component may include computer-executable instructions that, responsive to execution, cause at least a portion of the functionality described herein (e.g., one or more operations of the illustrative methods described herein) to be performed.

A software component may be coded in any of a variety of programming languages. An illustrative programming language may be a lower-level programming language such as an assembly language associated with a particular hardware architecture and/or operating system platform. A software component comprising assembly language instructions may require conversion into executable machine code by an assembler prior to execution by the hardware architecture and/or platform.

Another example programming language may be a higher-level programming language that may be portable across multiple architectures. A software component comprising higher-level programming language instructions may require conversion to an intermediate representation by an interpreter or a compiler prior to execution.

Other examples of programming languages include, but are not limited to, a macro language, a shell or command language, a job control language, a script language, a database query or search language, or a report writing language. In one or more example embodiments, a software component comprising instructions in one of the foregoing examples of programming languages may be executed directly by an operating system or other software component without having to be first transformed into another form.

A software component may be stored as a file or other data storage construct. Software components of a similar type or functionally related may be stored together such as, for example, in a particular directory, folder, or library. Software components may be static (e.g., pre-established or fixed) or dynamic (e.g., created or modified at the time of execution).

Software components may invoke or be invoked by other software components through any of a wide variety of mechanisms. Invoked or invoking software components may comprise other custom-developed application software, operating system functionality (e.g., device drivers, data storage (e.g., file management) routines, other common routines and services, etc.), or third-party software components (e.g., middleware, encryption, or other security software, database management software, file transfer or other network communication software, mathematical or statistical software, image processing software, and format translation software).

Software components associated with a particular solution or system may reside and be executed on a single platform or may be distributed across multiple platforms. The multiple platforms may be associated with more than one hardware vendor, underlying chip technology, or operating system. Furthermore, software components associated with a particular solution or system may be initially written in one or more programming languages, but may invoke software components written in another programming language.

Computer-executable program instructions may be loaded onto a special-purpose computer or other particular machine, a processor, or other programmable data processing apparatus to produce a particular machine, such that execution of the instructions on the computer, processor, or other programmable data processing apparatus causes one or more functions or operations specified in any applicable flow diagrams to be performed. These computer program instructions may also be stored in a computer-readable storage medium (CRSM) that upon execution may direct a computer or other programmable data processing apparatus to function in a particular manner, such that the instructions stored in the computer-readable storage medium produce an article of manufacture including instruction means that implement one or more functions or operations specified in any flow diagrams. The computer program instructions may also be loaded onto a computer or other programmable data processing apparatus to cause a series of operational elements or steps to be performed on the computer or other programmable apparatus to produce a computer-implemented process.

Additional types of CRSM that may be present in any of the devices described herein may include, but are not limited to, programmable random access memory (PRAM), SRAM, DRAM, RAM, ROM, electrically erasable programmable read-only memory (EEPROM), flash memory or other memory technology, compact disc read-only memory (CD-ROM), digital versatile disc (DVD) or other optical storage, magnetic cassettes, magnetic tape, magnetic disk storage or other magnetic storage devices, or any other medium which can be used to store the information and which can be accessed. Combinations of any of the above are also included within the scope of CRSM. Alternatively, computer-readable communication media (CRCM) may include computer-readable instructions, program module(s), or other data transmitted within a data signal, such as a carrier wave, or other transmission. However, as used herein, CRSM does not include CRCM.

Although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could," "might," or "may," unless specifically stated otherwise, or otherwise understood within the context as used, is generally intended to convey that certain embodiments could include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

What is claimed is:

1. A system for protecting a water-resistant microphone from electrostatic discharge, the system comprising:
   a microphone of a mobile device, the microphone attached to a printed circuit board;
   a microphone venting stack-up attached to the printed circuit board, the microphone venting stack-up comprising a membrane layer configured to prevent liquid entry into the microphone;
   a microphone port;
   an electrostatic discharge trap device positioned between the microphone port and the microphone venting stack-up, wherein the electrostatic discharge trap device is configured to receive an electric spark from the microphone port, wherein the electrostatic discharge trap device is positioned in between an exterior of the microphone port and the membrane layer; and a conductive layer between the electrostatic discharge trap device and the printed circuit board, wherein the conductive layer is configured to divert the electric spark from the electrostatic discharge trap device away from the microphone venting stack-up.

2. The system of claim 1, wherein the electrostatic discharge trap device comprises at least one of stainless steel, copper, or aluminum.

3. The system of claim 1, wherein an area of the electrostatic discharge trap device is at least six millimeters squared.

4. The system of claim 1, wherein the electrostatic discharge trap device is ring-shaped.

5. An electrostatic discharge trap device for protecting a microphone from electrostatic discharge, the electrostatic discharge trap device comprising:
   a conductive material positioned between a microphone port and a microphone venting stack-up comprising a membrane layer configured to prevent liquid entry into the microphone,
   wherein the electrostatic discharge trap device is configured to receive an electric spark from the microphone port and conduct the electric spark away from the microphone venting stack-up to a conductive layer, and
   wherein the electrostatic discharge trap device is positioned between an exterior of the microphone port and the membrane layer.

6. The electrostatic discharge trap device of claim 5, wherein the electrostatic discharge trap device is separated from the printed circuit board by the conductive layer.

7. The electrostatic discharge trap device of claim 5, wherein the area of the electrostatic discharge trap device is at least six millimeters squared.

8. The electrostatic discharge trap device of claim 5, wherein the electrostatic discharge trap device is ring-shaped.

9. The electrostatic discharge trap device of claim 5, wherein the electrostatic discharge trap device is positioned between the microphone port and a stiffener layer of the microphone venting stack-up.

10. The electrostatic discharge trap device of claim 5, wherein the electrostatic discharge trap device is positioned between the microphone port and a membrane layer of the microphone venting stack-up, wherein the membrane layer is configured to prevent the liquid entry into the microphone.

11. The electrostatic discharge trap device of claim 10, wherein the electrostatic discharge trap device is further configured to allow soundwaves to pass through the microphone venting stack-up.

12. A system for protecting a microphone from electrostatic discharge, the system comprising:
    a microphone of a device;
    a microphone venting stack-up operatively connected to a printed circuit board and comprising a membrane layer configured to prevent liquid entry into the microphone;
    a microphone port; and
    an electrostatic discharge trap device positioned between the microphone port and the microphone venting stack-up,
    wherein the electrostatic discharge trap device is configured to receive an electric spark from the microphone port, and
    wherein the electrostatic discharge trap device is positioned between an exterior of the microphone port and the membrane layer.

13. The system of claim 12, wherein an area of the electrostatic discharge trap device is at least six millimeters squared.

14. The system of claim 12, wherein the electrostatic discharge trap device is ring-shaped.

15. The system of claim 12, wherein the electrostatic discharge trap device is electrically connected to the printed circuit board by a conductive layer or a transient voltage suppressor diode.

16. The system of claim 15, wherein the conductive layer comprises a conductive foam.

17. The system of claim 12, wherein the electrostatic discharge trap device is positioned between the microphone port and a stiffener layer of the microphone venting stack-up.

18. The system of claim 12, wherein the electrostatic discharge trap device is positioned between the microphone port and a membrane layer of the microphone venting stack-up, wherein the membrane layer is configured to prevent the liquid entry into the microphone.

19. The system of claim 12, wherein the electrostatic discharge trap device is further configured to allow soundwaves to pass through the microphone venting stack-up.

20. The system of claim 12, wherein the microphone venting stack-up further comprises a first stiffening layer between the electrostatic discharge trap device and the membrane layer, and a second stiffening layer between the electrostatic discharge trap device and the printed circuit board.

* * * * *